(12) United States Patent
Imai et al.

(10) Patent No.: US 10,598,142 B2
(45) Date of Patent: Mar. 24, 2020

(54) ILLUMINATED MOMENTARY PUSH BUTTON SWITCH

(71) Applicant: KABUSHIKI KAISHA TOKAI RIKA DENKI SEISAKUSHO, Aichi (JP)

(72) Inventors: Toshiaki Imai, Aichi (JP); Ryoji Takahashi, Aichi (JP); Shuichi Iwata, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 16/150,824

(22) Filed: Oct. 3, 2018

(65) Prior Publication Data
US 2019/0107094 A1    Apr. 11, 2019

(30) Foreign Application Priority Data
Oct. 10, 2017    (JP) ................ 2017-196835

(51) Int. Cl.
| H01H 13/14 | (2006.01) |
| H01H 13/02 | (2006.01) |
| F02N 11/08 | (2006.01) |
| G06K 9/00 | (2006.01) |
| H01H 13/70 | (2006.01) |
| H05K 3/30 | (2006.01) |
(Continued)

(52) U.S. Cl.
CPC ........ *F02N 11/0803* (2013.01); *G06K 9/0002* (2013.01); *H01H 13/023* (2013.01); *H01H 13/14* (2013.01); *H01H 13/7006* (2013.01); *H05K 3/306* (2013.01); *F02N 2011/0874* (2013.01); *G06K 9/00013* (2013.01); *H01H 2001/0005* (2013.01); *H01H 2009/0083* (2013.01); *H01H 2009/187* (2013.01); *H01H 2013/026* (2013.01); *H01H 2219/062* (2013.01); *H01H 2225/01* (2013.01); *H01H 2229/046* (2013.01)

(58) Field of Classification Search
CPC .............. F02N 11/0803; F02N 11/087; F02N 2011/0874; G06K 9/0002; G06K 9/00013; H01H 13/023; H01H 13/14; H01H 13/7006; H01H 2013/026; H01H 2009/0083; H01H 2009/187; H01H 2219/062; H01H 2225/01; H01H 2229/046; H01H 2001/0005; H05K 3/306
See application file for complete search history.

(56) References Cited

U.S. PATENT DOCUMENTS

| 6,153,841 A * | 11/2000 | Hart ...................... H01H 13/58 200/314 |
| 9,543,089 B2 * | 1/2017 | Kirita ..................... H01H 13/52 |

FOREIGN PATENT DOCUMENTS

JP    2006-118481 A    5/2006

* cited by examiner

*Primary Examiner* — Vanessa Girardi
(74) *Attorney, Agent, or Firm* — Roberts Calderon Safran & Cole P.C.

(57) ABSTRACT

A switch device includes an operation button operated by a push operation on an operating surface, light sources arranged on a lighting substrate to illuminate an illumination target of the operation button, and a plurality of switches that are arranged on a switch substrate different from the lighting substrate so as to be located on an end portion side of the operation button and are turned on due to displacement of the operation button caused by the push operation.

6 Claims, 6 Drawing Sheets

(51) Int. Cl.
*H01H 9/00* (2006.01)
*H01H 9/18* (2006.01)
*H01H 1/00* (2006.01)

ILLUMINATED MOMENTARY PUSH BUTTON SWITCH

CROSS-REFERENCE TO RELATED APPLICATIONS

The present application is based on Japanese Patent Application No. 2017-196835 filed on Oct. 10, 2017, the entire contents of which are incorporated herein by reference.

TECHNICAL FIELD

The invention relates to a switch device.

BACKGROUND ART

Engine start control device is known as a conventional technique, which is provided with an engine start switch for giving an instruction to start an engine mounted on a vehicle, and first and second control circuits which are fed with power from a power source mounted on the vehicle and control engine start when the engine start switch is turned on and the instruction to start the engine is given (see, e.g., JP 2006/118481).

The engine start switch is constructed from a momentary push button switch and is turned on by a push operation.

SUMMARY OF INVENTION

Technical Problem

Some of such engine start control devices are configured that plural switches are arranged on one substrate to ensure redundancy of the engine start switch and light sources for illumination are arranged on the same substrate between the plural switches. Such engine start control devices have a problem that distances between switch contacts are increased due to the position of the light sources and operational feeling is degraded due to a time lag until all switches are tuned on by a push operation. Even if such engine start control devices are configured to make a failure determination when some switches are not turned on within a certain period of time after the first switch is turned on, there is a problem that an erroneous failure determination is made due to a time lag until all switches are tuned on even though no failure has occurred.

It is an object of the invention to provide a switch device that allows both improvement in operational feeling and prevention of erroneous failure determination while ensuring redundancy.

Solution to Problem

According to an embodiment of the invention, a switch device comprises:
an operation button operated by a push operation on an operating surface;
light sources arranged on a lighting substrate to illuminate an illumination target of the operation button; and
a plurality of switches that are arranged on a switch substrate different from the lighting substrate so as to be located on an end portion side of the operation button and are turned on due to displacement of the operation button caused by the push operation.

Effects of Invention

According to an embodiment of the invention, a switch device can be provided that allows both improvement in operational feeling and prevention of erroneous failure determination while ensuring redundancy.

DESCRIPTION OF EMBODIMENTS

Summary of Embodiment

A switch device in the embodiment is generally provided with an operation button operated by a push operation on an operating surface, light sources arranged on a lighting substrate to illuminate an illumination target of the operation button, and plural switches that are arranged on a switch substrate different from the lighting substrate so as to be located on an end portion side of the operation button and are turned on due to displacement of the operation button caused by the push operation.

In this switch device, the light sources and the plural switches are not arranged on the same substrate and this configuration allows the plural switches to be arranged more freely and densely than when arranged on the same substrate. Thus, a time lag until all the switches are tuned on is reduced and the switch device can achieve both improvement in operational feeling and prevention of erroneous failure determination while ensuring redundancy.

Embodiment

General Description of Start Switch Device 1

Figure 1A:
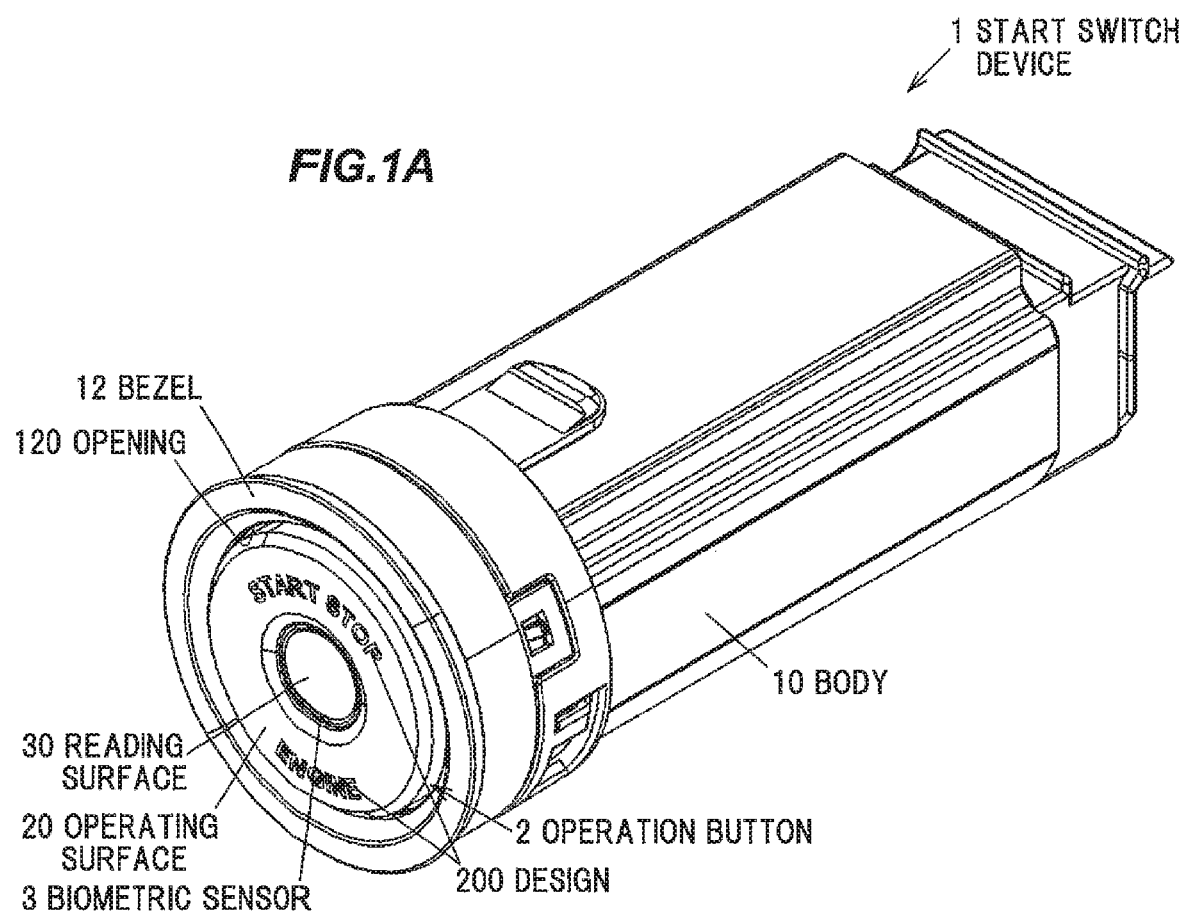
FIG. 1A is a perspective view showing an example of a start switch device in an embodiment.
Figure 1B:
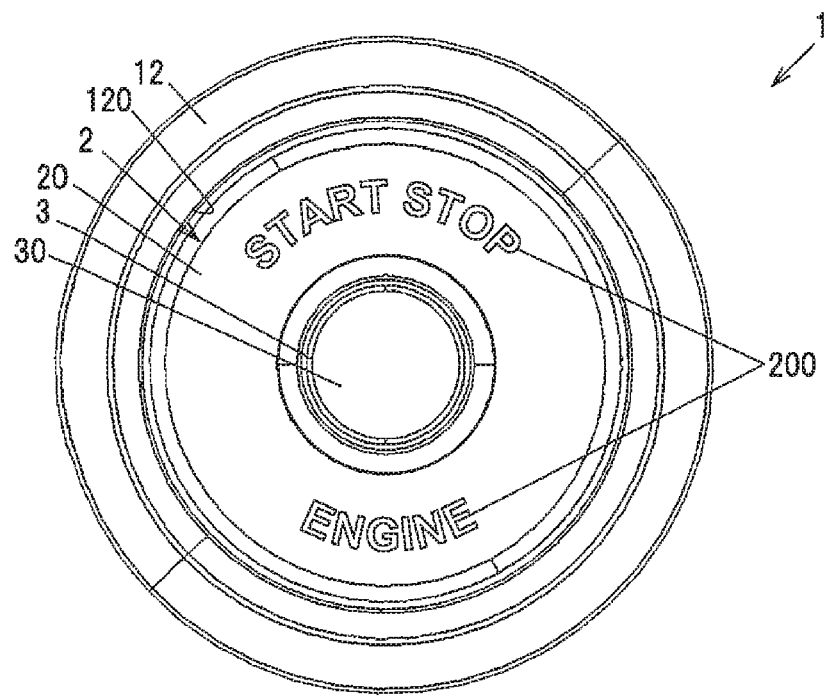
FIG. 1B is a front view showing the example of the start switch device.
Figure 2A:
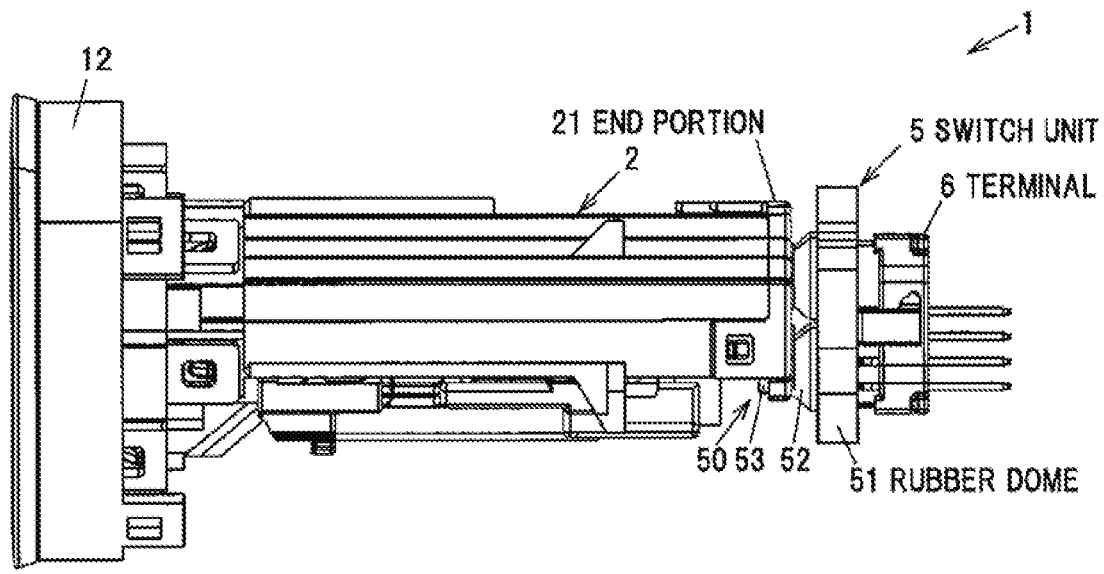
FIG. 2A is a schematic explanatory diagram illustrating an example of the inside of the start switch device in the embodiment.
Figure 2B:
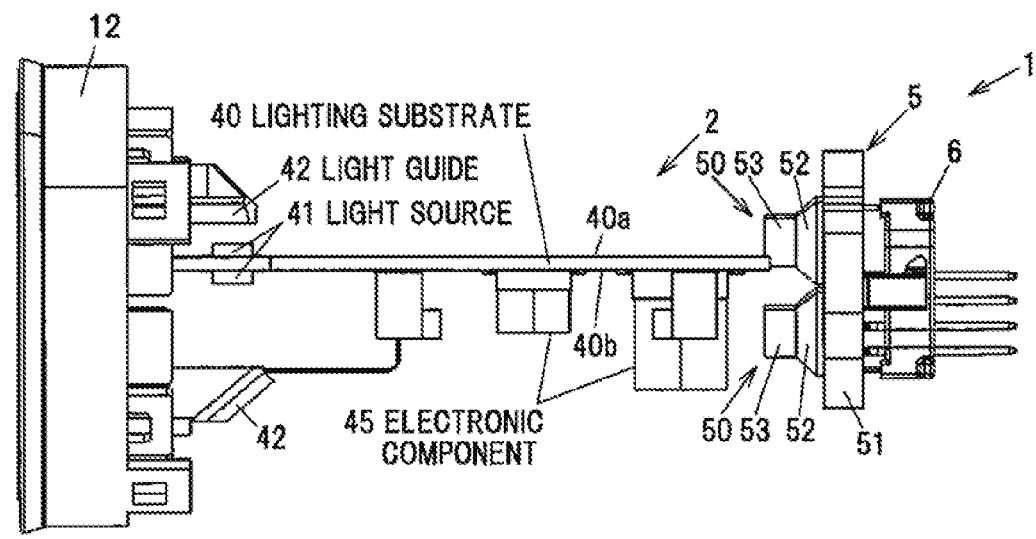
FIG. 2B is a schematic explanatory diagram illustrating an example arrangement of light sources in the start switch device.
Figure 3A:
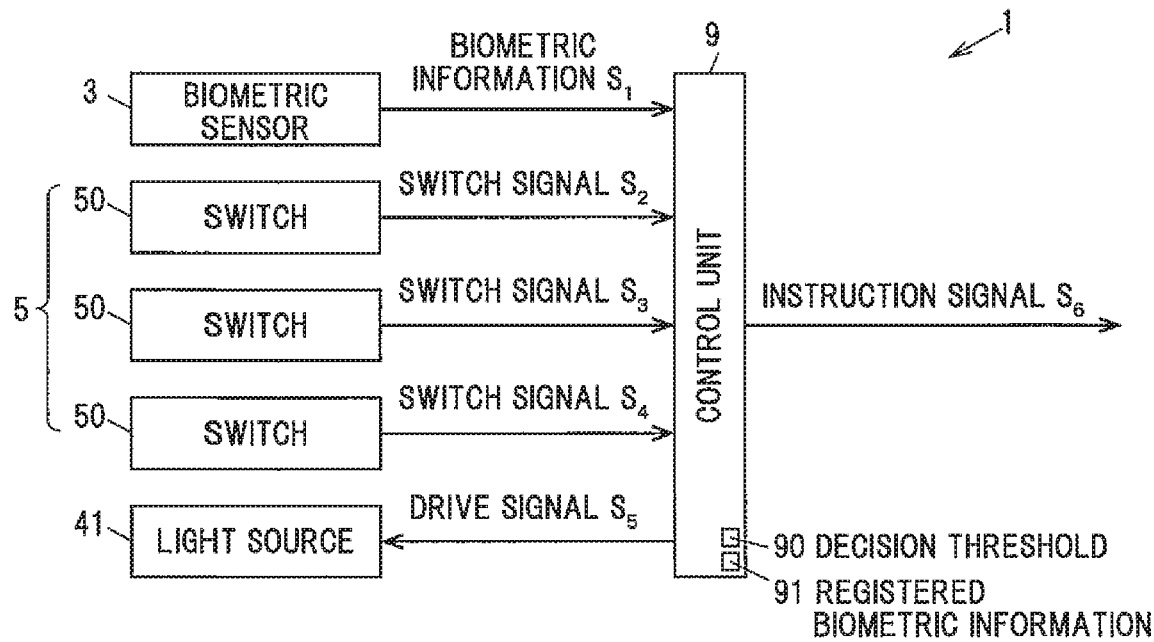
FIG. 3A is a block diagram illustrating an example of the start switch device in the embodiment.
Figure 3B:
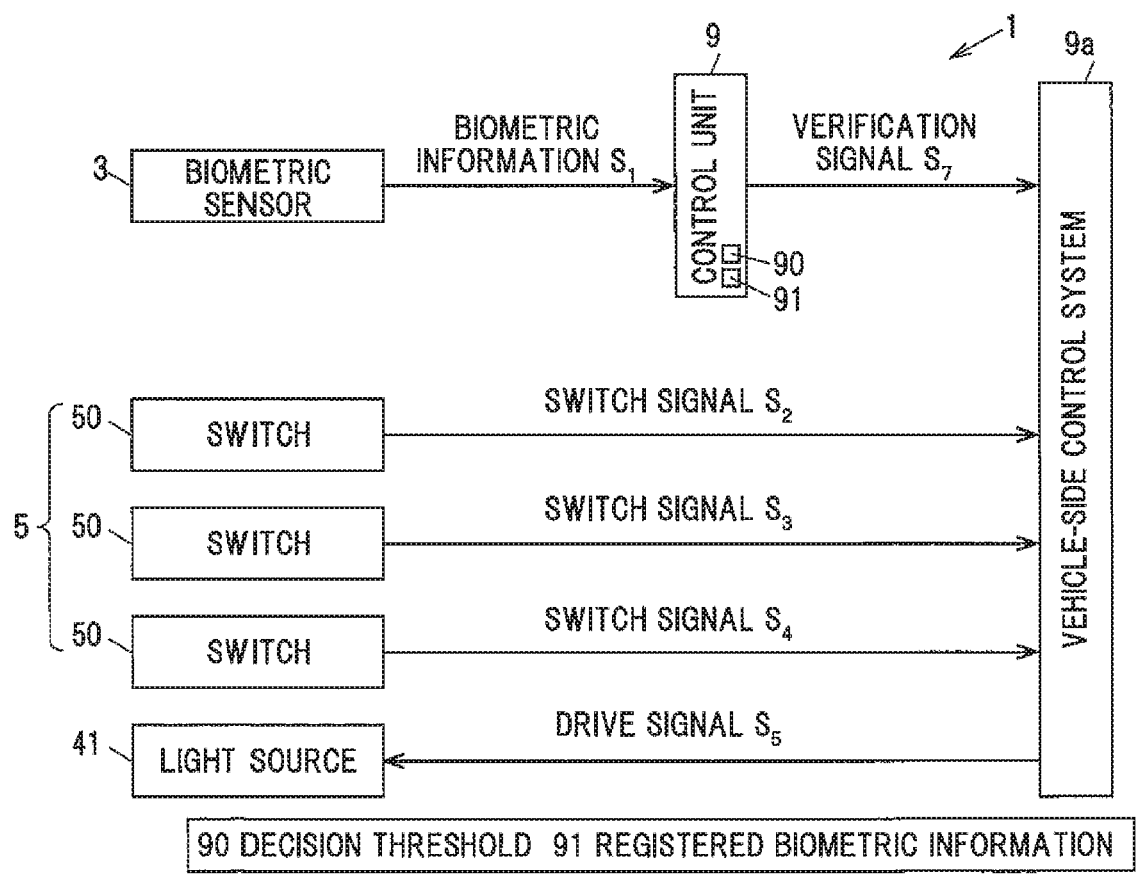
FIG. 3B is a block diagram illustrating an example of the start switch device in a modification.
Figure 4A:
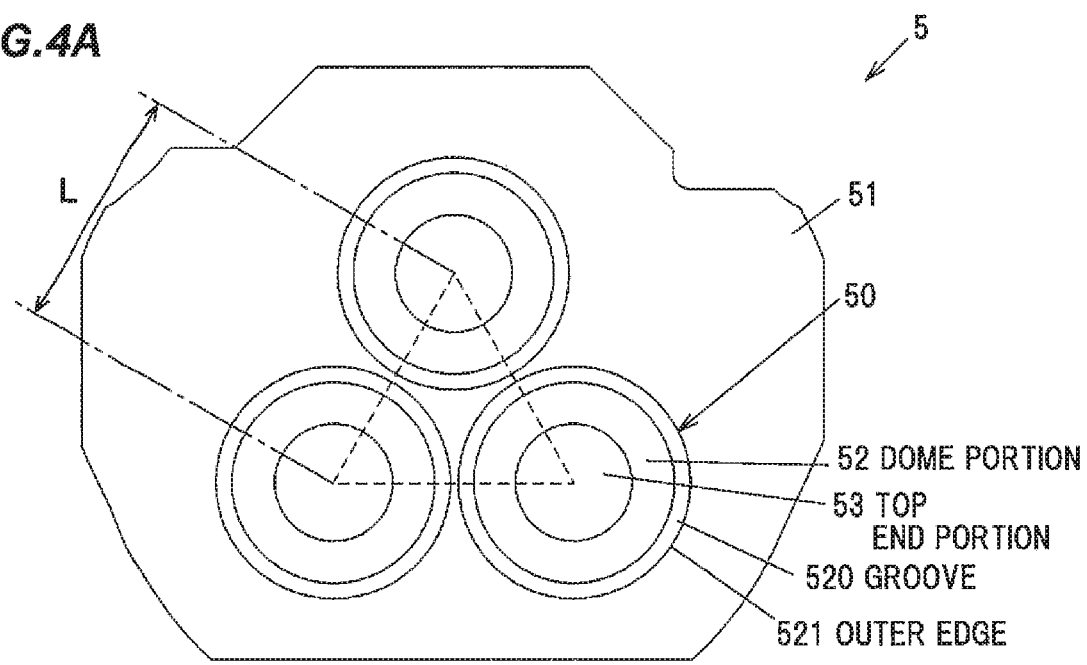
FIG. 4A is an explanatory top view showing an example of switches of the start switch device in the embodiment.
Figure 4B:
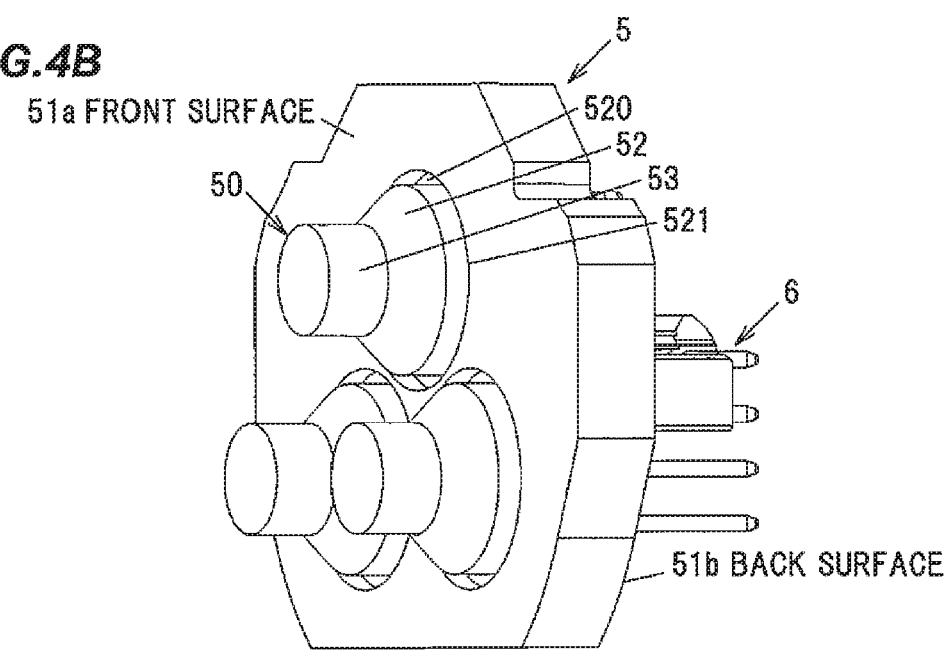
FIG. 4B is an explanatory perspective view showing an example of a switch unit.
Figure 4C:
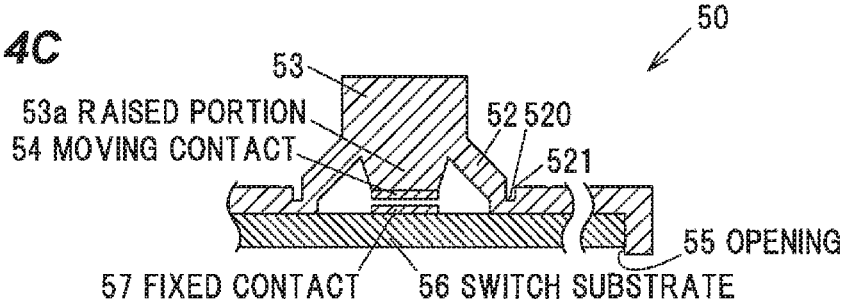
FIG. 4C is an explanatory cross-sectional view showing an example of an essential portion of the switch unit.

FIG. 1A is a perspective view showing an example of a start switch device in an embodiment and FIG. 1B is a front view showing the example of the start switch device. FIG. 2A is a schematic explanatory diagram illustrating an example of the inside of the start switch device in the embodiment and FIG. 2B is a schematic explanatory diagram illustrating an example arrangement of light sources in the start switch device. FIG. 3A is a block diagram illustrating an example of the start switch device in the embodiment and FIG. 3B is a block diagram illustrating an example of the start switch device in a modification. FIG. 4A is an explanatory top view showing an example of switches of the start switch device in the embodiment, FIG. 4B is an explanatory perspective view showing an example of a switch unit and FIG. 4C is an explanatory cross-sectional view showing an example of an essential portion of the switch unit. In each drawing of the embodiment described below, a scale ratio may be different from an actual ratio. In addition, in FIGS. 3A and 3B, flows of main signals and information are indicated by arrows.

The start switch device 1 as the switch device is generally provided with, e.g., an operation button 2 operated by a push operation on an operating surface 20, light sources 41 arranged on a lighting substrate 40 to illuminate an illumination target of the operation button 2, and plural switches 50 which are arranged on a switch substrate 56 different from the lighting substrate 40 so as to be located on an end portion 21 side of the operation button 2 and are turned on due to displacement of the operation button 2 caused by the push operation, as shown in FIGS. 1A to 4C.

The start switch device 1 is also provided with a biometric sensor 3 for reading, e.g., biometric information $S_1$ of an operator who operates the operation button 2, a switch unit 5 having the plural switches 50, and a control unit 9 which checks the biometric information $S_1$ read by the biometric sensor 3 against registered biometric information 91 which has been registered beforehand.

As an example, the start switch device 1 is configured that the biometric sensor 3 can read the biometric information $S_1$ after doors are unlocked upon authentication based on wireless communication with an electronic key, etc., and drive voltage is supplied from a battery of a vehicle. At this time, a design 200, which is an illumination target, is illuminated by the light sources 41.

In the vehicle, a drive system is started when the plural switches 50 of the start switch device 1 are turned on by a push operation and identity is established by the matching of the biometric information $S_1$.

The drive system is, e.g., an internal combustion engine, a motor, or a combination thereof, etc. The start switch device 1 is configured to give an instruction to start/stop the drive system. However, the switch device is not limited to the start switch device 1 for giving an instruction to start/stop a drive system of a vehicle and can be used for other purposes.

Configuration of the Operation Button 2

The operation button 2 is arranged, e.g., inside a cylindrical body 10 as shown in FIGS. 1A to 2B and is formed by combining several parts. For example, as shown in FIGS. 1A and 1B, a bezel 12 is attached to an end of the body 10 and the operating surface 20 of the operation button 2 is exposed in an opening 120 of the bezel 12.

The design 200 is formed on the operating surface 20. When, e.g., the operation button 2 is formed of a transparent resin such as polycarbonate and a black film not allowing light to pass through is formed on the operating surface 20, the design 200 is formed by partially removing the film with laser.

Alternatively, to form the design 200, for example, the operation button 2 and the design 200 may be formed by two-color molding, or a through-hole having the shape of design 200 may be formed on the operating surface 20 and filled with a transparent resin.

The design 200 has, e.g., a shape of characters as shown in FIGS. 1A and 1B. The design 200 is provided so that, e.g., written words sandwich the biometric sensor 3 and face each other.

The operation button 2 is generally provided, inside thereof, with the lighting substrate 40 and light guides 42 for guiding light output from the light sources 41 to the design 200, as shown in FIGS. 2A and 2B.

The lighting substrate 40 is, e.g., a printed circuit board. The lighting substrate 40 has a thin and long shape, and mounts electronic components 45 on a back surface 40b and the light sources 41 on a front surface 40a as well as on the back surface 40b.

The light source 41 is, e.g., an LED (Light Emitting Diode) element. The light sources 41 are arranged on the lighting substrate 40 so as to be located on the operating surface 20 side. The light guide 42 is formed of, e.g., a transparent resin extending from near the light source 41 to near the design 200 of the operating surface 20.

Configuration of the Biometric Sensor 3

The biometric sensor 3 is arranged at the center of the operating surface 20 of the operation button 2. The biometric sensor 3 is configured that a reading surface 30 for reading the biometric information $S_1$ has a circular shape and is exposed on the operating surface 20. The position of the reading surface 30 is lower than, e.g., the operating surface 20.

The biometric sensor 3 is configured to read the biometric information $S_1$ of an operating finger in contact with the operating surface 20. As an example, the biometric information $S_1$ includes image information of at least one of fingerprint pattern and vein pattern of the operating finger.

When configured to read, e.g., a fingerprint pattern, the biometric sensor 3 is generally constructed from an optical, capacitive, electric field strength measuring, pressure-sensitive, or thermal sensor.

Meanwhile, when configured to read, e.g., a vein pattern, the biometric sensor 3 is generally configured to read a vein pattern based on reflection of infrared radiation.

As an example, the biometric sensor 3 in the present embodiment is a capacitive sensor which reads a fingerprint. The biometric sensor 3 outputs the scanned fingerprint pattern, as the biometric information $S_1$, to the control unit 9.

Configuration of the Switch Unit 5

The switch unit 5 is generally composed of, e.g., a rubber dome 51 having plural moving contacts 54, and the switch substrate 56 having plural fixed contacts 57 facing the moving contacts 54, as shown in FIGS. 4A to 4C.

The rubber dome 51 is formed of, e.g., a flexible resin material such as silicon. Plural dome portions 52 generating an elastic force and having the moving contacts 54 are provided on a front surface 51a of the rubber dome 51. Each switch 50 has, e.g., a circular shape when viewed from above as shown in FIG. 4A and is composed mainly of the dome portion 52, the moving contact 54 and the fixed contact 57.

The dome portion 52 has, e.g., a cup shape as shown in FIGS. 4B and 4C. A raised portion 53a protruding downward is provided inside the dome portion 52, and the moving contact 54 is provided on a top of the raised portion 53a. The moving contact 54 is formed of a conductive metal material such as copper.

A top end portion 53 of the dome portion 52 has a columnar shape. The top end portion 53, when pressed by the operation button 2 due to a push operation, causes deformation of the dome portion 52 and brings the moving contact 54 into contact with the fixed contact 57. A groove 520 is formed around the dome portion 52. An outer circumference of the groove 520 is an outer edge 521 of the switch 50.

The rubber dome 51 has an opening 55 on a back surface 51b. The opening 55 has a shape corresponding to the shape of the switch substrate 56. The switch substrate 56 is inserted into the opening 55.

The switches 50 are arranged, e.g., with an inter-contact distance L which is equal for each switch 50 as shown in FIG. 4A and is the minimum in the allowable range. The dome portions 52 are densely arranged in the allowable range.

The switches 50 are provided so that, e.g., the centers lie on vertices of an equilateral triangle, as shown in FIG. 4A. The switches 50 are densely arranged within the allowable range which is a range allowing the grooves 520 to be formed. In detail, the switches 50 are densely arranged in such a manner that, e.g., the outer edge 521 of one switch 50 is located between the outer edges 521 of two switches 50 as shown in FIGS. 4A and 4B. This dense arrangement is possible since the outer edge 521 has, e.g., a circular shape. If the outer edge has a rectangular shape and when such rectangular outer edge is located between the other rectangular outer edges, the inter-contact distance is increased.

The plural switches 50, when turned on, output, e.g., switch signals $S_2$ to $S_4$ to the control unit 9, as shown in FIG. 3A.

The switch substrate 56 is provided with a terminal 6. The terminal 6 is configured to be connected to, e.g., a connector on the vehicle. The switch signals $S_2$ to $S_4$ are output through the terminal 6.

Configuration of the Control Unit 9

Figure 5A:
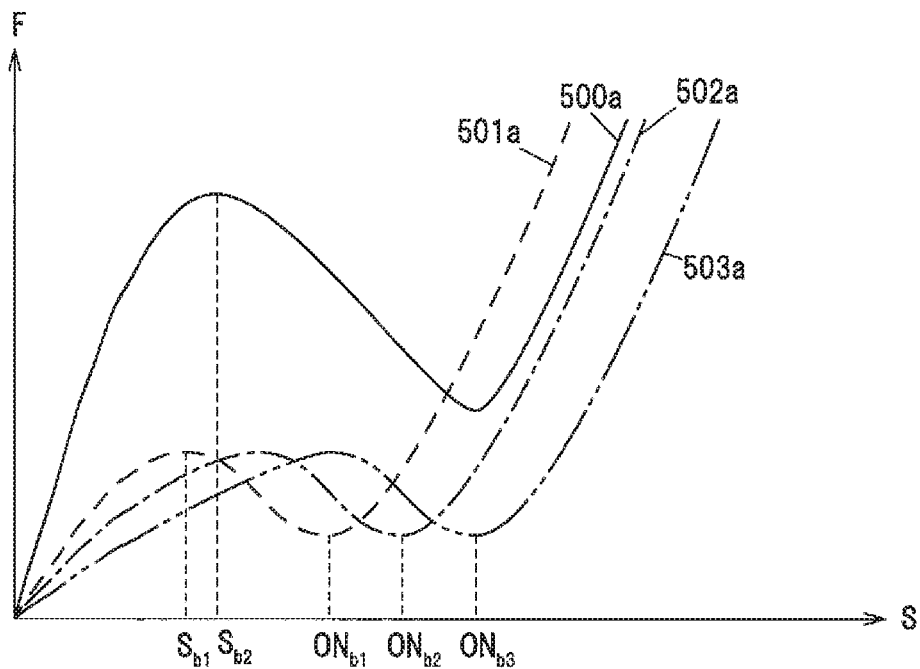
FIG. 5A is a graph showing an example of FS (force-stroke) curves of switches in Comparative Example.
Figure 5B:
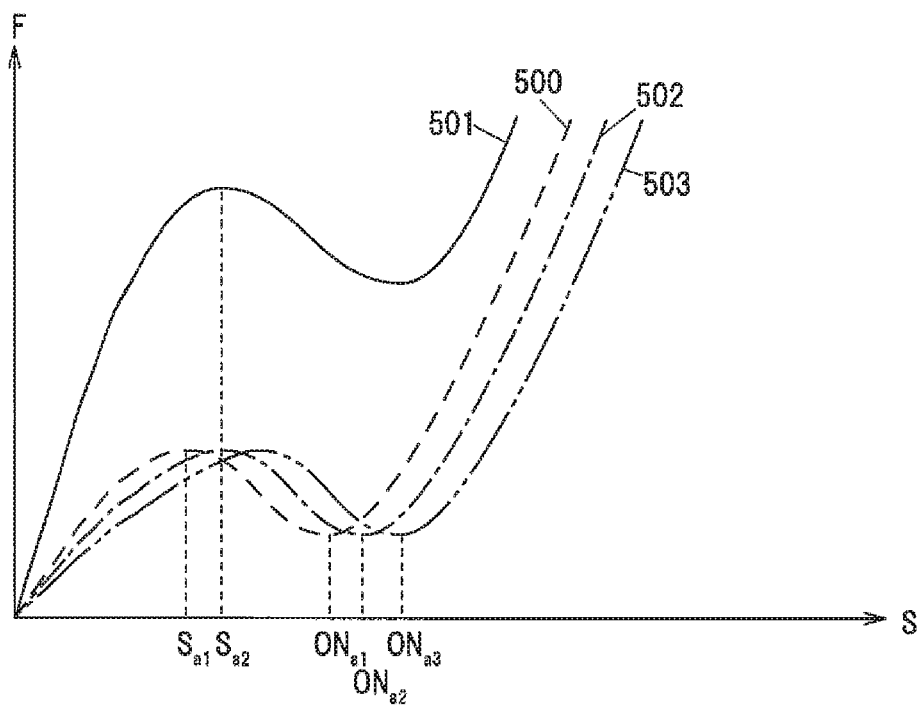
FIG. 5B is a graph showing an example of FS curves of the switches in the embodiment.

FIG. 5A is a graph showing an example of FS curves of switches in Comparative Example and FIG. 5B is a graph showing an example of FS curves of the switches in the embodiment. In FIGS. 5A and 5B, the horizontal axis indicates stroke (S) and the vertical axis indicates force (F). The stroke (S) is a stroke (a pushed amount) of the operation button 2. The force (F) is a force required to push down the operation button 2.

The control unit 9 is, e.g., a microcomputer composed of a CPU (Central Processing Unit) performing calculation and processing, etc., of the acquired data according to a stored program, and a RAM and a ROM (Read Only Memory) which are semiconductor memories. The ROM stores e.g. a program for operation of the control unit 9, a decision threshold 90 and the registered biometric information 91. The RAM is used as, e.g., a storage area for temporarily storing calculation results.

As an example, the control unit 9 determines that an operator is the registered person when the degree of similarity between the characteristics of the fingerprint pattern of the operator based on the biometric information $S_1$ acquired from the biometric sensor 3 and the characteristics of the fingerprint pattern of the registered person contained in the registered biometric information 91 is greater than the decision threshold 90.

Once it is determined that, e.g., the operator is the registered person and at least two switches 50 are turned on based on the switch signals $S_2$ to $S_4$, the control unit 9 generates an instruction signal $S_6$ to give a permission to start the drive system and outputs it to a vehicle control unit, etc. The control unit 9 also generates a drive signal $S_5$ and outputs it to the light sources 41 to illuminate the design 200.

The control unit 9 determines that the operation button 2 is push-operated only after at least two switches 50 are turned on. Ideally, it is preferable that the three switches 50 be turned on simultaneously. However, practically, the three switches 50 are highly likely to be tuned on at different timings due to tilt of the operation button 2 during displacement.

FIG. 5A shows FS curves 501a to 503a in Comparative Example when, e.g., light sources are arranged between three switches and the inter-contact distance (<L) is large. The switches in Comparative Example have the same configuration as the switches 50 in the present embodiment, except that the inter-contact distance is larger than the inter-contact distance L in the present embodiment.

The FS curve 501a shows that the force increases as the operation button is pushed down until reaching a stroke $S_{b1}$, the force required to push down decreases after reaching the stroke $S_{b1}$, and the force increases again after exceeding a stroke $ON_{b1}$ at which the switch is turned on, as shown in FIG. 5A.

At the stroke $ON_{b1}$, the moving contact comes into contact with the fixed contact due to deformation of the dome portion and the switch is turned on. At a stroke $ON_{b2}$ of the FS curves 502a and also at a stroke $ON_{b3}$ of the FS curve 503a, the moving contact comes into contact with the fixed contact due to deformation of the dome portion and the switch is turned on in the same manner.

In Comparative Example, the time from the stroke $ON_{b1}$ to the stroke $ON_{b3}$ is proportional to the inter-contact distance and is long. This is because the operation button is displaced with an inclination and comes into contact with the three switches not simultaneously but with a time lag.

FIG. 5B shows FS curves 501 to 503 in the embodiment when the three switches 50 are densely arranged and the inter-contact distance L is smaller than that in Comparative Example.

The FS curve 501 shows that, e.g., the force increases as the operation button is pushed down until reaching a stroke $S_{a1}$, the force required to push down decreases after reaching the stroke $S_{a1}$, and the force increases again after exceeding a stroke $ON_{a1}$ at which the switch 50 is turned on, as shown in FIG. 5B.

In the start switch device 1 of the present embodiment, for example, the time from the stroke $ON_{a1}$ to the stroke $ON_{a3}$ is proportional to the inter-contact distance L and is shorter than that in Comparative Example as shown in FIG. 5B.

In Comparative Example, for example, a FS curve 500a indicated by a solid line in FIG. 5A is a FS curve when the operation button 2 is push-operated. In the present embodiment, for example, a FS curve 500 indicated by a solid line in FIG. 5B is a FS curve when the operation button 2 is push-operated.

As a modification, the configuration may be such that, as an example, the control unit 9 is responsible for checking the biometric information $S_1$ and a vehicle-side control system 9a determines whether the switches 50 are on or off, as shown in FIG. 3B.

The vehicle-side control system 9a is, e.g., a microcomputer mounted on the vehicle. The vehicle-side control system 9a acquires, e.g., a verification signal $S_7$ from the control unit 9 and the switch signals $S_2$ to $S_4$ from the switch unit 5, as shown in FIG. 3B. The verification signal $S_7$ is a signal indicating that, e.g., the operator is the registered person.

Once it is determined that, e.g., the operator is the registered person and at least two switches 50 are turned on, the vehicle-side control system 9a starts the drive system of the vehicle. The vehicle-side control system 9a also determines whether or not failure has occurred, based on the time lag until all switches 50 are turned on. That is, as an example, the vehicle-side control system 9a determines that failure has occurred when all switches 50 are not turned on within a predetermined period of time. Such failure determination function may be provided on, e.g., the control unit 9.

To improve accuracy of failure determination, it is better to have a shorter time lag from when the first switch is turned on to when the last switch is turned on. Since, for example, the time lag in the present embodiment (the time from the stroke $ON_{a1}$ to the stroke $ON_{a3}$) is shorter than the time lag in Comparative Example (the time from the stroke $ON_{b1}$ to the stroke $ON_{b3}$) as shown in FIGS. 5A and 5B, the accuracy of failure determination in the present embodiment is better than that in Comparative Example.

In view of preventing malfunction, timing of switching on and off in the start switch device 1 is set to during snap in the FS curve. Furthermore, in the start switch device 1, the above-mentioned short time lag leads to improvement in operational feeling and it is also easy to configure to have a shorter stroke.

The snap in Comparative Example (from stroke $S_{b2}$ to stroke $NO_{b3}$) is longer than that in the present embodiment (from stroke $S_{a2}$ to stroke $NO_{a3}$). Therefore, the start switch device 1 in the present embodiment has a shorter stroke and provides better operational feeling than Comparative Example.

Figure 6:
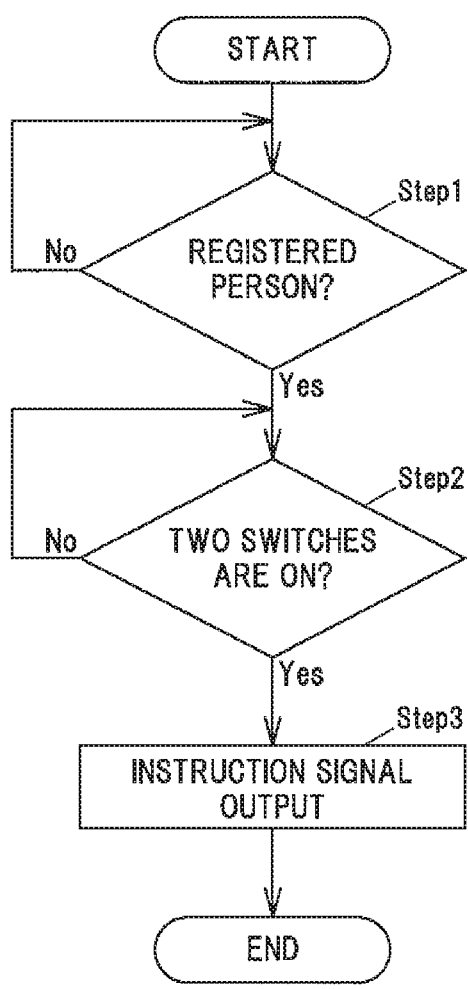
FIG. 6 is a flowchart showing an example operation of the start switch device in the embodiment.

Next, an example of an operation of the start switch device 1 in the present embodiment to start the drive system will be described using the flowchart of FIG. 6.

Operation

When, e.g., the doors of the vehicle are unlocked by authentication of the electronic key, the control unit 9 of the start switch device 1 generates the drive signal $S_5$ and output it to the light sources 41 to illuminate the design 200.

Then, the control unit 9 monitors the biometric information $S_1$ output from the biometric sensor 3. The control unit 9 compares the biometric information $S_1$, which is scanned when the operator performs a push operation, with the registered biometric information 91 and determines whether or not the degree of similarity is equal to or greater than the decision threshold 90.

When the determination in Step 1 is "Yes", i.e., when the operator is the registered person (Step 1: Yes), the control unit 9 monitors the switch signals $S_2$ to $S_4$.

When the determination in Step 2 is "Yes", i.e., when at least two switches 50 are turned on based on the switch signals $S_2$ to $S_4$ (Step 2: Yes), the control unit 9 outputs the instruction signal $S_6$ to give an instruction to start the drive system, based on the determination that the operation button 2 is push-operated by the registered person (Step 3). The control unit of the vehicle activates the drive system based on the instruction signal $S_6$.

The determinations in Step 1 and Step 2 may be made in the reverse order. The control unit 9 may alternatively be configured to, e.g., discard the matching result of the biometric information $S_1$ in case that the time from when identity is established by the matching of the biometric information $S_1$ to when all switches 50 are turned on is equal or greater than a predetermined period of time.

When, e.g., one or two switches 50 are turned on but not all the switches 50 are turned on within a predetermined period of time, e.g., after identity is established by the matching of the biometric information $S_1$, i.e., in Step 2, the control unit 9 determines that the switch 50 fails, and the control unit 9 outputs the instruction signal $S_6$ indicating such determination result.

To stop the drive system, the start switch device 1, without checking the biometric information, outputs the instruction signal $S_6$ to give an instruction to stop the drive system after the three switches 50 are turned on.

Effects of the Embodiment

The start switch device 1 in the present embodiment can achieve both improvement in operational feeling and prevention of erroneous failure determination while ensuring redundancy. In detail, in the start switch device 1, the light sources 41 and the three switches 50 are not arranged on the same substrate and this configuration allows the three switches 50 to be arranged more freely and densely than when arranged on the same substrate. Thus, the start switch device 1 has a shorter time lag until the three switches 50 are turned on. Since the short time lag allows for prevention of the erroneous failure determination, the start switch device 1 can achieve both improvement in operational feeling and prevention of erroneous failure determination while ensuring redundancy.

In the start switch device 1, the inter-contact distance L can be reduced by densely arranging the three switches 50. Therefore, as compared to the case where the switches cannot be densely arranged and the inter-contact distance is large, the start switch device 1 can easily have a shorter stroke and thus can provide better operational feeling. In addition, in the start switch device 1, since plural switches 50 can be densely arranged without causing a decrease in operational feeling, redundancy can be ensured by providing plural switches unlike when such configuration is not adopted.

Since the substrate mounting the light sources 41 is different from the substrate mounting the switches 50 in the start switch device 1, the light sources 41 can be arranged closer to the illumination target than when the light source and switches are arranged on the same substrate. As a result, the start switch device 1 can effectively illuminate the illumination target.

Although some embodiment and modifications of the invention have been described, the embodiment and modifications are merely an example and the invention according to claims is not to be limited thereto. The new embodiment and modifications may be implemented in various other forms, and various omissions, substitutions and changes, etc., can be made without departing from the gist of the invention. In addition, all combinations of the features described in the embodiment and modifications are not necessary to solve the problem of the invention. Further, the embodiment and modifications are included within the scope and gist of the invention and also within the invention described in the claims and the range of equivalency.

The invention claimed is:
1. A switch device, comprising:
   an operation button operated by a push operation on an operating surface;
   light sources arranged on a lighting substrate to illuminate an illumination target of the operation button; and
   a plurality of switches that are arranged on a switch substrate different from the lighting substrate so as to be located on an end portion side of the operation button and are turned on due to displacement of the operation button caused by the push operation,
   wherein the plurality of switches comprise three switches, and wherein centers of the three switches are arranged at vertices of an equilateral triangle.
2. The switch device according to claim 1, wherein the operation button internally comprises the lighting substrate and light guides for guiding light output from the light sources to the illumination target.

3. The switch device according to claim 1, wherein the plurality of switches comprise a momentary engine start switch.

4. The switch device according to claim 1, wherein an outer edge of one of the three switches is partly located between outer edges of other two switches.

5. The switch device according to claim 1, wherein the plurality of switches are arranged with an inter-contact distance that is equal for each switch and is the minimum in an allowable range.

6. The switch device according to claim 5, wherein
each of the plurality of switches comprises a rubber dome having a plurality of dome portions that generate an elastic force, and a moving contact, and the switch substrate comprises a plurality of fixed contacts, each of which faces one of the moving contacts of the plurality of switches, wherein the rubber domes of the plurality of switches are densely arranged in the allowable range.

* * * * *